(12) United States Patent
Matsutani et al.

(10) Patent No.: US 7,197,440 B2
(45) Date of Patent: Mar. 27, 2007

(54) FINITE ELEMENT METHOD LIBRARY, FINITE ELEMENT METHOD PROGRAM, AND STORAGE MEDIUM

(75) Inventors: Shigeki Matsutani, Kanagawa (JP); Akira Asai, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 494 days.

(21) Appl. No.: 10/192,159

(22) Filed: Jul. 11, 2002

(65) Prior Publication Data

US 2003/0065492 A1    Apr. 3, 2003

(30) Foreign Application Priority Data

Jul. 11, 2001    (JP)    ............... 2001-211187

(51) Int. Cl.
G06F 17/10    (2006.01)
G06F 9/44    (2006.01)

(52) U.S. Cl. .......................................... 703/2; 717/106
(58) Field of Classification Search ................... 703/2; 717/104, 106

See application file for complete search history.

(56) References Cited

U.S. PATENT DOCUMENTS

| | | | |
|---|---|---|---|
| 5,148,379 A | 9/1992 | Konno et al. ............... | 364/578 |
| 5,590,345 A * | 12/1996 | Barker et al. ................. | 712/11 |
| 5,911,035 A * | 6/1999 | Tsao ............................ | 706/16 |
| 5,966,444 A * | 10/1999 | Yuan et al. .................. | 380/283 |
| 2002/0198670 A1 * | 12/2002 | Christiansen et al. ......... | 702/65 |
| 2004/0034514 A1 * | 2/2004 | Langemyr et al. ............. | 703/2 |

FOREIGN PATENT DOCUMENTS

| | | |
|---|---|---|
| JP | 53-110896 A | 9/1978 |
| JP | 61-010771 A | 1/1986 |
| JP | 6-231216 A | 8/1994 |
| JP | 6-231217 A | 8/1994 |
| JP | 7-120275 B2 | 12/1995 |
| JP | 7-120276 B2 | 12/1995 |
| JP | 9-185729 A | 7/1997 |
| JP | 9-259300 A | 10/1997 |
| JP | 2765888 B2 | 4/1998 |

OTHER PUBLICATIONS

Griebel, M., et al., "*Parallel Adaptive Subspace Correction Schemes With Applications To Elasticity*," Computer Methods in Applied Mechanics and Engineering, vol. 184 (2000), pp. 303-332.

Courant, R., *Variational Methods For The Solution of Problems of Equilibrium and Vibrations*, Bulletin of the American Mathematical Society, vol. 49 (1943), pp. 1-23.

M. J. Turner et al., *Stiffness and Deflection Analysis of Complex Structures*, Journal of the Aeronautical Sciences, V. 23, N. 9, 805-823 (1956).

* cited by examiner

*Primary Examiner*—Paul Rodriguez
*Assistant Examiner*—Andre Pierre-Louis
(74) *Attorney, Agent, or Firm*—Fitzpatrick, Cella, Harper & Scinto

(57) ABSTRACT

It provides a finite element method library which improves the reliability of a program using the finite element method as a library, and avoids calculation errors and an increase in convergence time due to programming errors. To this end, a library that describes a program process based on the finite element method is characterized in that a vector of a vector space spanned by basis functions of the finite element method, and a dual vector of a dual vector space defined by a metric derived from an inner product which is determined by the square integrations of the basis functions, are defined as different abstract data types.

4 Claims, 4 Drawing Sheets

FINITE ELEMENT METHOD LIBRARY, FINITE ELEMENT METHOD PROGRAM, AND STORAGE MEDIUM

FIELD OF THE INVENTION

The present invention relates to the configuration of a basic simulator library of a finite element method.

BACKGROUND OF THE INVENTION

According to Iwanami's Dictionary of Mathematics (third edition), discovery of the finite element method is accredited to either the article of Courant (Bull. Amer. Math. Soc., 49 (1943)) or the article of M. J. Turner et al., (J. Aero. Sci. 23 (1956) 805–823). In either case, the contribution of that method to the engineering field is still enormous almost half a century after its discovery; many articles are published every year and many textbooks are written. For example, O. C. Zienkiewicz, Masao Yoshiki & Yoshiaki Yamada (TR), "Matrix Finite Element Method", third revised edition, (Baifukan, 1984), and Motoki Yagawa & Shinobu Yoshimura, "Finite Element Method" (Baifukan, 1991) are known.

Furthermore, inventions that pertain to the finite element methods have been made, and Japanese Patent Publication No. 61-10771 is known as an early one. Especially, various proposals have been made in association with a mesh generation method. For example, Japanese Patent Laid-Open No. 6-231216, 6-231217, 9-185729, 9-259300, and the like are known.

The basic concept of the finite element method grounds on the Ritz's method that obtains the solution of a partial differential equation defined as a boundary-value problem by approximating a function space F as a domain of definition of differential operators by a real finite dimensional Hilbert space H (since a real matrix expression is available even when the function space F assumes complex number values, only a case of a real number is explained without losing generality). As the inner product of the Hilbert space H, a natural inner product derived from the square integral (L2) norm (Iwanami's Dictionary of Mathematics, third edition, Iwanami, p. 61, 1994) is used. Also, as in the Ritz's method, approximation is evaluated in a weak topology. The finite dimensional Hilbert space H is defined by a set (V, <,>) of a finite dimensional vector space V and inner products <,>. In this case, linear mapping from V to F is designed to be injection, and various operations (e.g., differential operations) to F can be naturally limited to V as those operations to V.

Many finite element methods are characterized by using a function which has a very narrow support (closure of a nonzero set) as a basis function of the finite dimensional Hilbert space. For this purpose, a metric M determined by natural inner products <,>; in the Hilbert space (V, <,>) with respect to the finite dimensional vector space V, i.e., linear mapping from V to its dual space V*

$$M: V \to V^* \tag{1}$$

is generally obtained as a sparse matrix. Note that M is determined so that an inner product $$<,>: V \times V \to R \tag{2}$$

as bi-linear mapping to real number R matches $$(,M): V \times V \to R, ((u, Mv) \in R), \tag{3}$$

using natural pairing $(,): V \times V^* \to R$. Also, differential operators to the function space F can be considered as bounded operators (i.e., having real number coefficient finite dimensional matrix listing) on the finite dimensional Hilbert space H by the aforementioned natural limitations. Since the above limitations are not always homomorphic as an operator ring, they are not a natural inclusion as an operator ring. However, it is important to consider the vector space V as a natural inclusion of the function space F as a real number value vector space, and it is also important to consider that the finite element method is a numerical calculus technique defined on a finite dimensional operator ring.

Since a function having a very narrow support is used as a basis function of V, as described above, a matrix expression of metric M and many physical differential operators in H normally becomes a very sparse matrix (a matrix which has a very small ratio of the number of nonzero elements to the total degree of freedom). For this reason, numerical calculations can be very easily made.

In this manner, the mechanism itself of the finite element method has universality and versatility. An automatic generation program for automatically generating a program of the finite element method, and a finite element method library that provides a basic part of the finite element method as a library have been developed using such universality and versatility.

As examples of the automatic generation program, Japanese Patent Publication Nos. 7-120275 and 7-120276, and U.S. Pat. No. 2,765,888 are known. However, the automatic generation program has little flexibility since it is not easy to change inputs/outputs in correspondence with subjects.

On the other hand, as an example of the finite element method library, a library named Diffpack is introduced in Hans Petter Langtangen, "Computational Partial Differential Equations: Numerical Methods and Diffpack Programming, (Lecture Notes in Computational Science and Engineering, 2, Springer, 1999. Furthermore, formulation of the finite element method on the hierarchical structure lattices shown in FIG. 3 as a base for a substantial finite element method library has been proposed. For example, such proposal has been described in detail in Michael Griebel & Gerhard Zumbusch, "Parallel adaptive subspace correction schemes with applications to elasticity", Computer Methods in applied mechanics and engineering 184, p. 303–332 (2000) and its references.

Note that the finite element method library includes fundamental variable declarations, and subroutine and function sets, which are used to complete a self-produced finite element method program corresponding to each individual problem by defining variables in accordance with each individual problem and combining functions and the like provided by the library by the programmer as the user. Since processes by the finite element methods are mathematically formulated in the library, the method using the library can easily generate a finite element method program according to each individual problem (e.g., the strength of materials, mechanics of continua, electromagnetics, and the like) compared to generation of a finite element method program using the aforementioned automatic generation program.

However, the user often uses the finite element method as a library without recognizing the metric given by formula (1). Many textbooks of linear algebra normally are based on an orthogonal normal basis as a base of a vector space, and do not consider a dual space and metric. As a result, the user introduces an inner product which is different from a natural inner product of the finite element method in the vector space, and such use distorts the original Hilbert space H of the finite element method, resulting in a quite different Hilbert space. The inner product of the Hilbert space is (bi-linear) mapping from a vector space to real numbers as quantities (ordered set), the magnitudes of which are to be compared, and the change of this inner product means definition of a quite different magnitude relation. In practice, since it is natural to make error evaluation or the like using this mapping to real numbers, the change in inner product often results in serious errors.

In general, an operator ring is defined as a ring of operators on the Hilbert space, and the inner product of the Hilbert space plays a very important role in the operator ring. In case of a function space as an infinite dimensional vector space, a target phenomenon is often largely converted depending on the inner product. As described above, it is natural to consider the finite element method as the finite dimensional operator ring. However, since the finite element method simulates a physical space as an infinite dimensional vector space, the inner product must be carefully taken account. Hence, from such point of view, careless use of the inner product results in loss of mathematical rationality.

In fact, it is a common practice in the finite element method to define, as the basis function, a connected support (closure of a domain of definition having nonzero values) on a cell or on the vicinity of that cell of non-structured lattices shown in FIG. 4. Individual cells have different volumes. On the other hand, nonzero matrix elements of a metric matrix have strong correlation to the volumes of individual cells in the finite element method, and a large volume ratio of elements means a large difference among the matrix elements. Hence, definition of another inner product without respect to the metric M results in delay of convergence and deterioration of precision. This poses problems of precision and reliability of the finite element method library itself, and is an important subject upon generating a library.

In this manner, it is important to generate a program that can correctly calculate the inner product in the Hilbert space upon using the finite element method as a library in terms of the reliability of a program such as a reduction of calculation errors, an improvement in convergence time, and the like.

SUMMARY OF THE INVENTION

The present invention has been made in consideration of the above problems, and has as its object to provide a finite element method library which can improve the reliability of a program using the finite element method as a library, and can avoid calculation errors and deterioration of a convergence time due to programming errors.

In order to achieve the above object, for example, a finite element method library of the present invention comprises the following arrangement. That is, there is provided a finite element method library that describes a program process based on a finite element method, wherein a vector of a vector space spanned by basis functions of the finite element method, and a dual vector of a dual vector space defined by a metric derived from an inner product which is determined by square integrations of the basis functions, are defined as different abstract data types.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

<Apparatus Arrangement>

Figure 1:
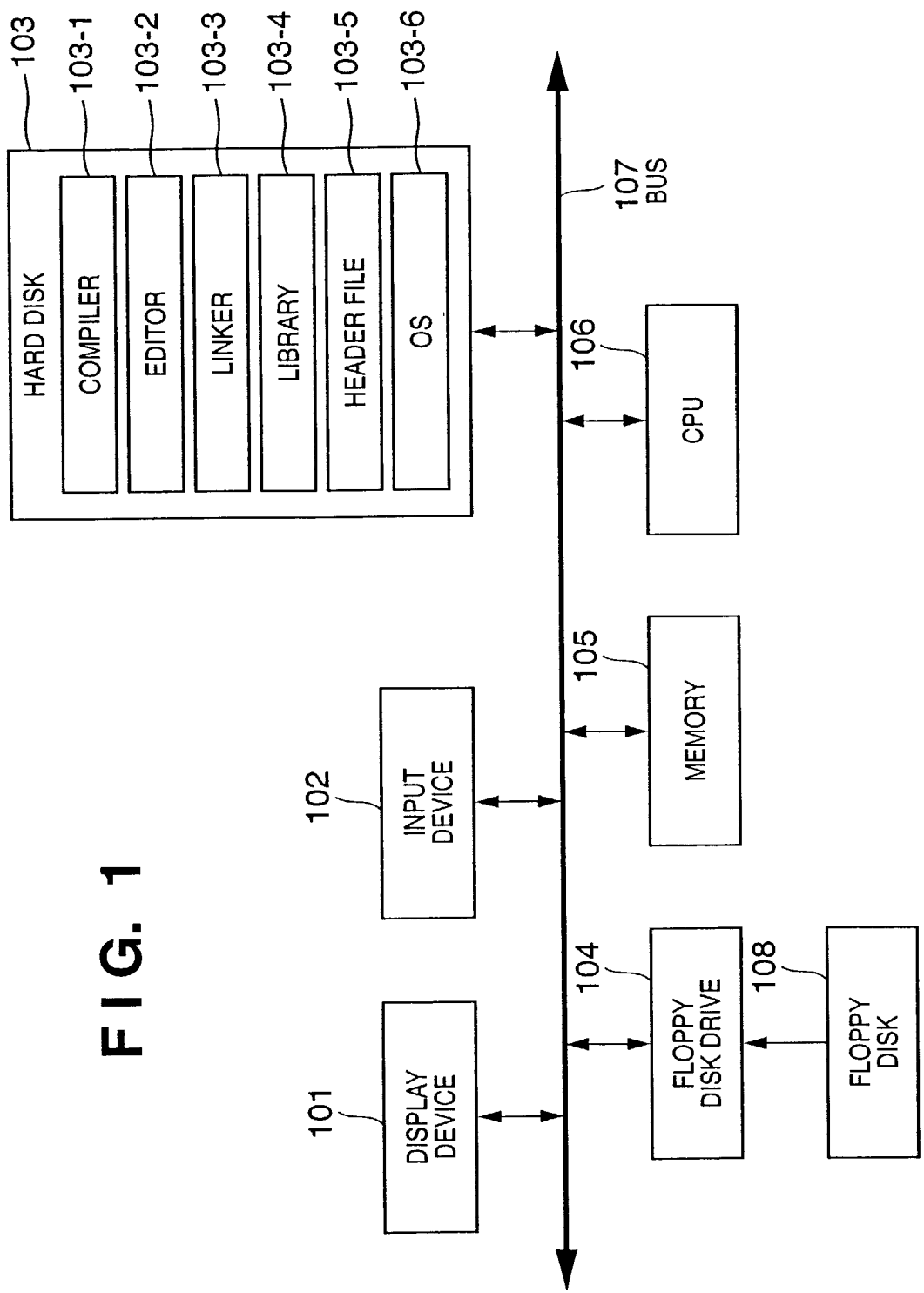
FIG. 1 is a block diagram showing an example of a processing apparatus which comprises a finite element method library according to an embodiment of the present invention.

FIG. 1 is a block diagram showing an example of a processing apparatus which comprises a finite element method library according to an embodiment of the present invention. A programmer programs a finite element method program using this processing apparatus.

Referring to FIG. 1, reference numeral 101 denotes a display device such as a CRT or the like; and 102, various input devices such as a keyboard, mouse, or the like. Various programs are stored in a hard disk 103. Such programs are loaded onto a memory 105 via a bus 107, and are processed by a CPU 106.

The programs stored in the hard disk 103 are required to generate a finite element method program. Reference numeral 103-6 denotes an OS; 103-2, an editor used to describe a program; 103-4, various libraries; 103-5, a header file; 103-1, a compiler; and 103-3, a linker.

Note that these programs stored in the hard disk 103 may be stored in a floppy disk 108, and may be loaded via a floppy disk drive 104.

<Flow of Program Generation>

Figure 2:
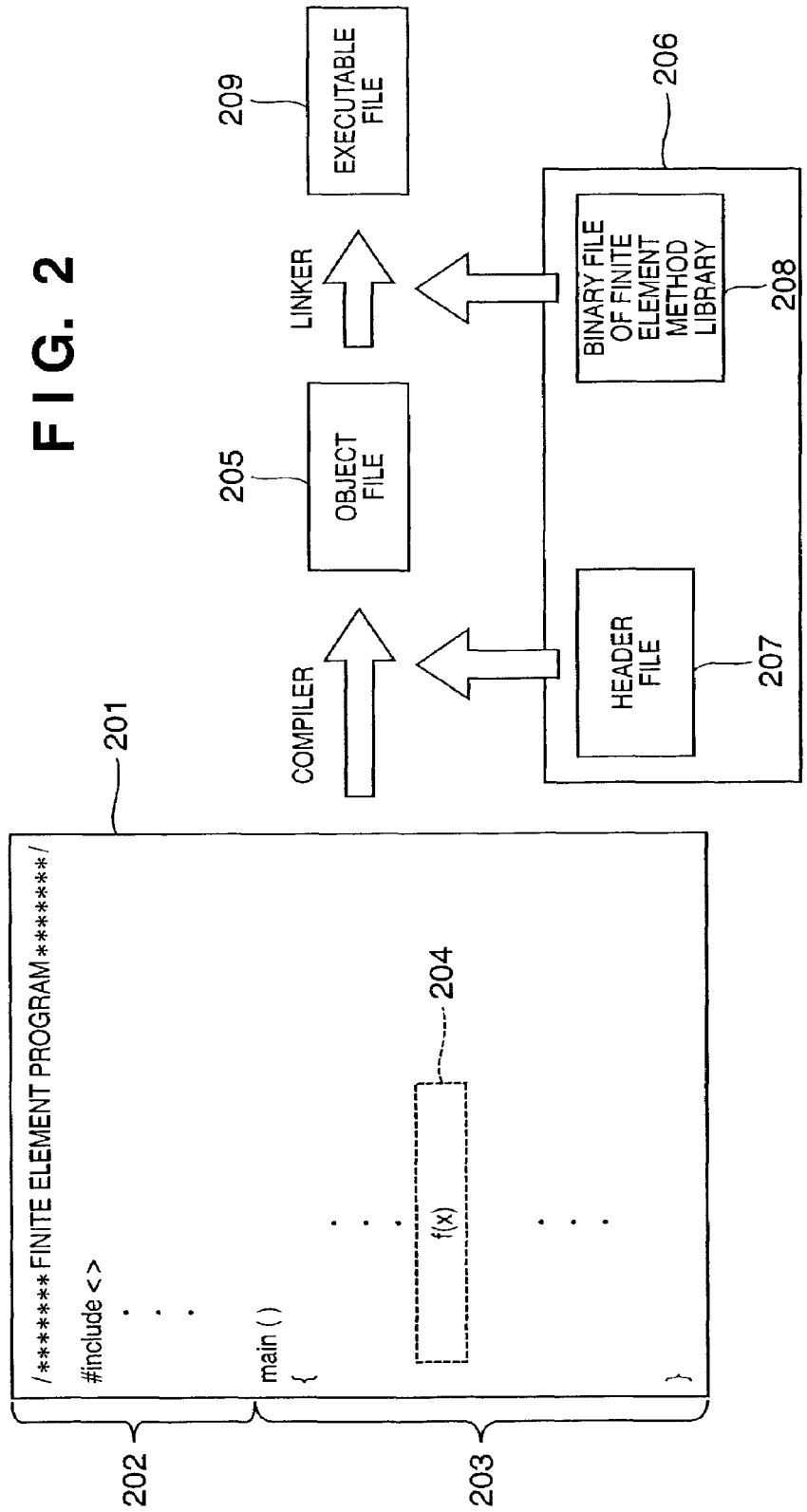
FIG. 2 is a view showing the sequence in which a programmer programs a finite element method program using the processing apparatus according to the embodiment of the present invention.
Figure 3:
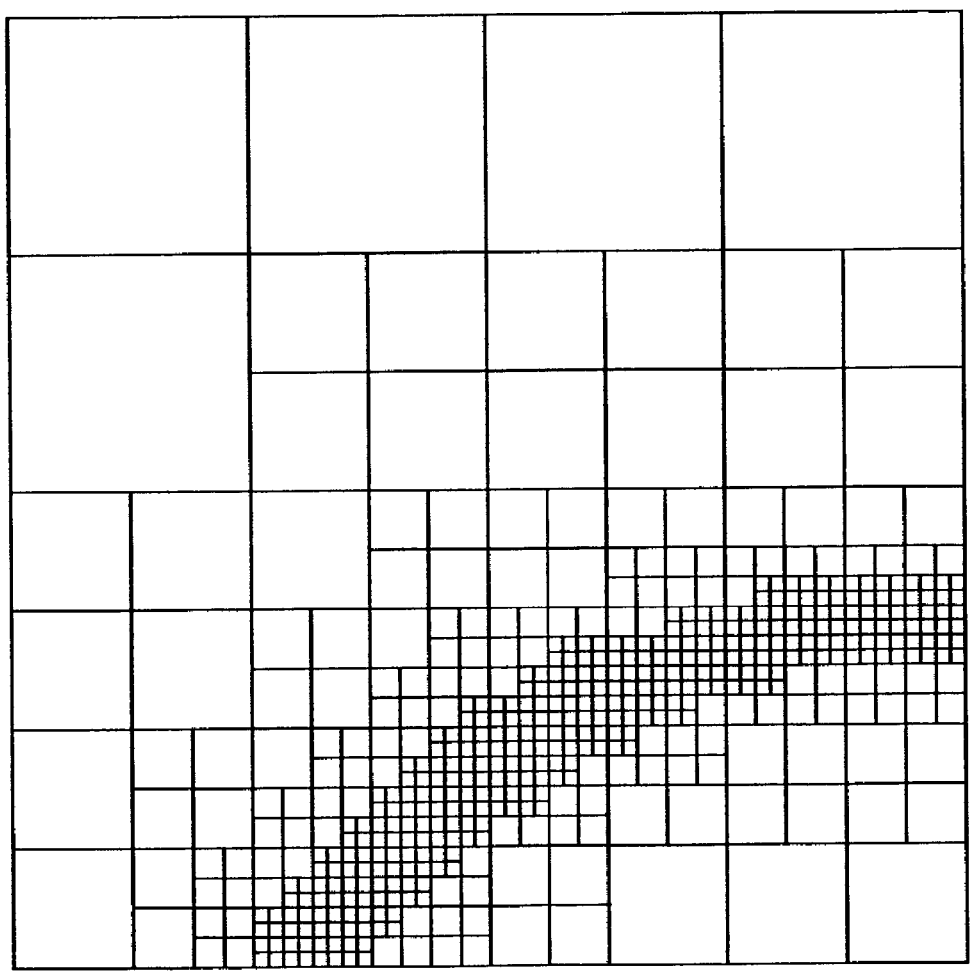
FIG. 3 is a view for explaining the finite element method.
Figure 4:
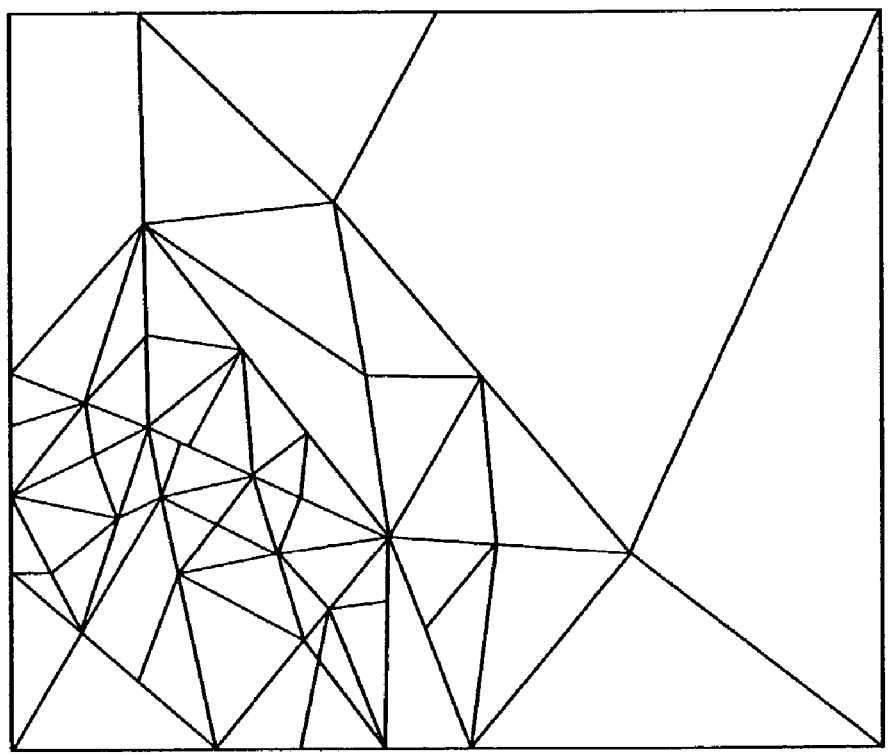
FIG. 4 is a view for explaining the finite element method.

FIG. 2 shows the sequence in which the programmer programs a finite element method program using the above processing apparatus.

Reference numeral 201 denotes a finite element method program (source) programmed using the editor 103-2, and the finite element method program 201 has a header field 202 and a field 203 that describes the processing contents. The programmed finite element method program 201 is compiled using the compiler 103-2 to generate an object file 205, to which the libraries 103-4 are linked by the linker 103-3, thus generating an executable file 209. In FIG. 2, reference numeral 206 denotes a finite element method library according to this embodiment of the plurality of libraries 103-4 to be linked by the linker 103-3. More specifically, the finite element method library 206 comprises a header file 207 present as a text file, and a binary file 208 of the finite element method library. Of these files, the binary file 208 of the finite element method library is linked by the linker 103-3, and the header file 207 is loaded upon being compiled by the compiler 103-2.

The finite element method library 206 is loaded from the hard disk 103 onto the memory 105 when it is used, in response to a signal from the input device 102 such as a keyboard, mouse, or the like input by the user, who develops a computer simulation program (finite element method program 201) which exploits the finite element method to analyze a physical phenomenon. As for the use method, the program is used by preparing its specification sheet of this embodiment. By launching the editor 103-2 using inheritance of classes in accordance with the specifications of respective classes, a program is described as an ASCII file, and the header file 207 (file name: FEM.h) upon compiling and the source 208 (file name: libFEM.a) of the finite element method library upon linking in generation of an execution program are loaded on the memory 105 together with the program when that program is used.

With such flow of program generation, the programmer debugs bugs in the program on the basis of errors upon compiling or linking.

<Finite Element Method Library>

Details of the finite element method library 206 in FIG. 2 according to the embodiment of the present invention will be described below.

In the finite element method library according to the embodiment of the present invention, as a type that represents a vector space, a type named FEMVector is defined in the header file 207 using a structure. Likewise, FEMCovector is prepared as vectors of a dual space. The present invention does not depend on individual type-declared names, but specific names are used in the above and following descriptions for the sake of simplicity.

FEMGeometry is defined as a structure which has discrete geometric information that expresses a system. For example, structure FEMGeometry holds a sequence of FEMNode as structures which express lattice points.

A function f(x) (204 in FIG. 2) described by the programmer in accordance with each individual problem is expressed by using basis e[N](x) that assume nonzero values in neighboring cells of each lattice point N and zero in other cells, and distributing real numbers f[N] to the basis. That is, f(x) is expressed by the linear combination given by:

$$f(x) = \sum_{\text{all lattice points } N} f[N]e[N](x) \quad (4)$$

A set {f[N]| N is all lattice points} of these real numbers distributed to the basis is considered as elements f=(f[N]) of the vector space V in this specification. FEMVector is defined as a structure that contains this set {f[N]| N is all lattice points} as a string. In this manner, the function f and vector space {f[N]| N is all lattice points} defined on the system, and FEMVector as the contents of the memory 105 on the processing apparatus can be identified. Since there is no confusion about symbols, it is expressed by f.

On the other hand, a natural inner product $$M[N, N'] = \int_{\text{entire domain of system}} d^n x e[N](x)e[N'](x) \quad (5)$$

is defined between neighboring basis, and it is natural to consider this inner product as a metric as linear mapping from the vector space V to the dual vector space V* (N' indicates a lattice point different from N). Note that n is a quantity that represents a dimension which assumes 3 if the system is a three-dimensional system or 2 if the system is a two-dimensional system. Due to the linearity of the space, a matrix M is determined by only the natures of geometric information and basis e[N], and does not depend on individual vectors f. Hence, a dual vector f* (=f*[N]) of the vector f is defined by:

$$f^*[N] = \sum_{\text{all lattice points } N'} M[N, N']f[N'] = \quad (6)$$

$$\int_{\text{entire domain of system}} d^n x e[N](x) f(x)$$

In the finite element method library 206 of this embodiment, a new structure named FEMCovector is defined on the definition field 207 to form the quantity defined as described above on the memory 105 of the computer. That is, the matrix M is implemented as means for converting FEMVector into FEMCovector. That is, in the finite element method library 206 of this embodiment, $$DualMap(f) = f^*, \ f^*[N] = \sum_{\text{all lattice points } N} M[N, N']f[N'] \quad (7)$$

is defined as a function. In general, since the calculation of an inverse matrix of M requires high calculation cost, no inverse operation of the above operation is prepared in the finite element method library 206 of this embodiment. However, such function may be prepared, or a function that implements the inverse operation by approximation may be prepared.

As already described, an operation of a desired partial differential operator L to the function space F is limited to the Hilbert space H used by the finite element method library 206 of this embodiment, and is defined via:

$$(L)[N, N'] = \int_{\text{entire domain of system}} d^n x e[N](x) L e[N'](x) \quad (8)$$

In consideration of this fact, the operation of the desired partial differential operator L to the function f of the system of this embodiment is implemented in the program as:

$$(Lf)[N] = \int_{\text{entire domain of system}} d^n x e[N](x) L f(x) \quad (9)$$

That is, an operation of L to f is defined as a conversion matrix from FEMVector to FEMCovector, and an operation of L to f is stored as FEMCovector on the memory 105.

In the finite element method library of this embodiment, pairing of such natural vector space and its dual space is included as a global function Pairing(FEMVector f, FEM Covector G). That is, the global function Pairing(FEMVector f, FEMCovector G) is defined by:

$$\text{Pairing}(f, G) = \sum_{\text{all lattice points } N} f[N]G[N] \quad (10)$$

If elements of the vector space V are defined to have G=g* (i.e., g=M−1 G), a natural inner product $$\text{Pairing}(f, g^*) = \langle f, g \rangle = \int_{\text{entire domain of system}} d^n x f(x) g(x) \quad (11)$$

derived from the square integral (L2) norm of the function space (Iwanami's Dictionary of Mathematics, third edition, Iwanami, p. 61, 1994) can be implemented using f and g as the functions of the system. Hence, the finite element method library 206 of this embodiment provides natural pairing "Pairing" alone in place of the inner products of vector spaces or those of dual spaces.

Using this Pairing, an inner product like <f,Lg> can be calculated. When (L) [N, N'] and M[N, N'] are uniquely determined if the geometry and basis function are determined, and the carrier of the basis function is locally defined, matrix elements can be calculated very easily. In practice, the domains of integrals that appear in M[N, N'] and (L) [N, N'] are on the entire domain. However, if U[N] is defined as a carrier of e[N] due to locality of the support (closure of a domain of definition having nonzero values) of the basis function, integrals of equations (5) and (8) are respectively changed to:

$$(L)[N, N'] = \int_{U[N] \cap U[N']} d^n x e[N](x) L e[N'](x) \quad (12)$$

$$M[N, N'] = \int_{U[N] \cap U[N']} d^n x e[N](x) e[N'](x) \quad (13)$$

That is, the integral can be calculated only in the intersection of supports, and can be simply expressed in general. Especially, implementation in the structured lattices or their hierarchical expression is very easy.

As can be seen from equations (12) and (13), (L) [N, N'] and M[N, N'] are associated with the volume of U[N]∩U[N']. Especially, it is apparent that M[N, N'] has positive correlation if a non-negative value function is used as e[N]. For this reason, in the finite element method in which the volumes of U[N]∩U[N'] are not constant, the ratio of each nonzero element of the metric M[N, N'] is normally very large, and approximation of it to a unit matrix considerably impairs the precision, convergence speed, and the like of the calculation results.

First Embodiment

In the first embodiment, an example of the header file 207 of the finite element method library 206 described in the above embodiment will be explained.

The finite element method library of this embodiment is configured based on C++ complying with the standards of ISO and ANCI in 2000. As a matter of course, the configuration of the above embodiment can obtain the same result if another programming language is used.

For this purpose, as a type that expresses a vector space, a type FEMVector is defined using an object-oriented class. Likewise, FEMCovector is prepared as a vector of a dual space.

Parts in the source of the finite element method library of this embodiment, which are associated with the above embodiment, are listed below.

As a class having lattice point information, FEMNode is defined by:

```
Class FEMNode{
    double      x, y, z;
    int         i:
    int         njs;
    int*        j;
    FEMNode*    Next;
public:
    FENNode( double x, double y, double z,
             int i, int j1, int j2, int j3,
             int j4, int j5=−1, int j6=−1 );
    int geti( ){ return i;}
    ...
};
```

FEMGeometry that totalizes them is prepared.

```
class FEMGeometry{
    int         Nsize;
    int         Csize;
    FEMNode*    Np;
    FEMCell*    Cp;
public:
    ...
};
```

Using these classes, a class that includes a real number sequence is defined as FEMVector.

```
class FEMVector{
    FEMGeometry*    Geomp;
    double*         Vp;
public:
    FEMVector(FEMGeotmetry& Geom, const int& Nodenumber) {
      Geomp = &Geom;
      Vp = new double [Nodenumber];
    }
    double& operator( ) (FEMNode N) {
      return Vp[N.geti( )];
    }
    ...
};
```

As described in the embodiment of the present invention, FEMCovector is defined by:

```
class FEMCovector{
    FEMGeometry*    Geomp;
    double*         Vp;
public:
    FEMCovector(FEMGeometry& Geom, const int& Nodenumber) {
      Geomp = &Geom;
      Vp = new double [Nodenumber];
    }
    double& operator( ) (FEMNode N) {
      return Vp[N.geti( )];
    }
    ...
};
```

The following three global functions are prepared:
FEMCovector DualMap(FEMVector& f);
FEMCovector Laplacian(FEMVector& f);
double Pairing(FEMVector& f, FEMCovector& g);

The contents of these functions are respectively given by equations (7), (9) and (10). Note that Laplacian uses a Laplacian operator as a linear partial differential operator. Furthermore, these functions are given as global functions, but may be member functions of appropriate classes or may be capsulated using namespace or the like.

In the finite element method library generated in this manner, the header file 206 is linked upon compiling, the binary field (the source 208 of the finite element method library) is linked upon linking and execution like in a normal library, and the finite element method library is used as a finite element method program used to solve various physical problems.

A physical quantity inherited from FEMVector, e.g., temperature in case of an equation of heat conduction, is defined, and the equation is solved according to physical requests. For example, we can write:

class Temperature :public FEMVector{double unit;

. . .

}

If the user who uses a library for the above type definition forms Pairing of FEMVector and FEMvector or FEMCovector and FEMCovector by mistake, a compile error occurs, and the user must recognize the metric space in the finite element method, thus avoiding precision drop and deficiency of reliability due to careless programming. For this reason, the reliability of the library for the calculation result itself can also be improved.

Second Embodiment

In the first embodiment, FEMVector and FEMCovector are considered as types, but they may be distinguished using namespace or a truth quantity. That is, enum SpaceType{Vector, Covector}; is defined to define following FEMSpace in place of FEMVector and FEMCovector of the first embodiment:

```
class FEMSpace{
    FEMGeometry*    Geomp;
    double*         Vp;
    SpaceType       Dual
public:
    FEMspace(FEMGeometry& Geom, const int& Nodenumber,
    SpaceType& D) {
        Geomp = &Geom;
        VP = new double [Nodenumber];
        Dual = D;
    }
    double& operator( ) (FEMNode N) {
        return Vp[N.geti( )];
    }
};
```

In correspondence with this,
FEMSpace DualMap(FEMSpace& f);
FEMSpace Laplacian(FEMSpace& f);
double Pairing(FEMSpace& f, FEMSpace& g);

are given as global functions. Note that DualMap(f) and Laplacian(f) execute condition processes for, e.g., generating an error and terminating a program, and so forth if SpaceType as a member of their argument f is not Vector, and set SpaceType of FEMSpace as a return value to be Covector if f is Vector. Also, Pairing(f, g) has a conditional statement that a program does not run upon execution if SpaceType of f and g are Vector and Vector; or Covector and Covector. The reason why DualMap (f) undergoes a measure for terminating a program if SpaceType of f is Covector is that it is generally difficult to calculate an inverse matrix of the metric M given by formula (1). Of course, DualMap may be defined as mapping from a dual space to a space by approximation or strictly.

Furthermore, these functions are given as global functions, but may be member functions of appropriate classes or may be capsulated using namespace or the like.

With this configuration, the user recognizes, as an error, his or her misapprehension about the metric space as the subject of the present invention upon execution of a program. Hence, the reliability of the finite element method library and a program using that library can be improved. That is, problems such as calculation errors, an increase in convergence time, and the like due to user's misapprehension can be avoided.

Third Embodiment

The basic principle of the finite element method library of the present invention can be formed independently of programming languages. For example, a program can be generated in Fortran90 and C. Also, a program that can obtain the same effects can be programmed using Pascal or the like. Furthermore, a similar program can be generated using an STL function of C++.

Fourth Embodiment

In the description of the present invention, a physical quantity is expressed by a real number value function. However, the present invention can be applied to a case wherein a physical quantity is expressed by a multi-dimensional vector value or complex number value. Especially, using a language that is compatible to generic programming in high-level languages such as C++ or the like, simple implementation can be made.

As described above, according to the present embodiment, the reliability of a program that uses the finite element method as a library can be improved, and calculation errors, an increase in convergence time, and the like due to programming errors can be avoided.

As many apparently widely different embodiments of the present invention can be made without departing from the spirit and scope thereof, it is to be understood that the invention is not limited to the specific embodiments thereof except as defined in the claims.

What is claimed is:

1. A program generation apparatus comprising:
 a library that describes a program process based on a finite element method,
 wherein a vector of a vector space spanned by basis functions of the finite element method, and a dual vector of a dual vector space defined by a metric derived from an inner product which is determined by square integrations of the basis functions, are defined as different data types in said library;
 a compiler that compiles a source program into an object file with reference to said library;

a processor for processing the program;
a memory for receiving the program;
an error detector that checks data types of items of an inner product in the source program to be compiled by said compiler and informs of an error if the data types of the items of the inner product in the source program are identical; and a display device that displays a detected error.

2. The apparatus according to claim 1, wherein in said library, a first attribute data that indicates a vector is assigned in a first class which expresses the vector in the vector space spanned by the basis functions, and a second attribute data indicating a dual vector is assigned in a second class that expresses the dual vector space.

3. The apparatus according to claim 2, further comprising a confirming unit that confirms whether or not an arithmetic result using the vector of the vector space or the dual vector of the dual vector space has predetermined attribute data upon compiling by said compiler.

4. The apparatus according to claim 1, wherein in said library, an operation of a representation matrix to a desired vector of the vector space is defined as mapping to the dual vector space with respect to the representation matrix as a weak form of a desired linear partial differential operator to the vector space and the dual vector space.

* * * * *

UNITED STATES PATENT AND TRADEMARK OFFICE
CERTIFICATE OF CORRECTION

PATENT NO. : 7,197,440 B2 Page 1 of 1
APPLICATION NO. : 10/192159
DATED : March 27, 2007
INVENTOR(S) : Shigeki Matsutani et al.

It is certified that error appears in the above-identified patent and that said Letters Patent is hereby corrected as shown below:

COLUMN 2

Line 35, "Programming," should read -- Programming",--.
　　　Line 37, "Springer, 1999." should read --Springer, 1999).--.

COLUMN 3

Line 13, "In case" should read --In the case--.
　　　Line 21, "account." should read --into account.--.

COLUMN 6

Line 67, "f, FEM" should read --f, FEM- --.

COLUMN 8

Line 19, "FENNode( double x, double y, double z," should read
　　　　　--FEMNode ( double x, double y, double z,--.
　　　Line 41, "FEMVector(FEMGeotmetry& Geom, const int&" should read
　　　　　--FEMVector(FEMGeometry& Geom, const int&--.

COLUMN 9

Line 19, "in case" should read --in the case--.

Signed and Sealed this

Twentieth Day of November, 2007

JON W. DUDAS
*Director of the United States Patent and Trademark Office*